US006596964B2

(12) United States Patent
Accou

(10) Patent No.: US 6,596,964 B2
(45) Date of Patent: Jul. 22, 2003

(54) METHOD OF ATTACHING A COMPONENT TO A CONNECTION SUPPORT BY WELDING WITHOUT THE ADDITION OF MATERIAL

(75) Inventor: Jan Firmin Accou, Hertain (BE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/188,674

(22) Filed: Jul. 3, 2002

(65) Prior Publication Data

US 2003/0010759 A1 Jan. 16, 2003

(30) Foreign Application Priority Data

Jul. 10, 2001 (FR) .............................. 01 09169

(51) Int. Cl.7 ............................................. B23K 26/20
(52) U.S. Cl. ................................................ 219/121.64
(58) Field of Search ...................... 219/121.64, 121.82, 219/121.6, 121.63, 121.65, 121.66; 29/840, 843, 842, 860

(56) References Cited

U.S. PATENT DOCUMENTS

| 4,023,005 A | | 5/1977 | Bolin ......................... 219/121 |
| 5,226,052 A | * | 7/1993 | Tanaka et al. ................ 372/36 |
| 5,292,559 A | * | 3/1994 | Joyce, Jr. et al. ........... 427/597 |
| 5,481,082 A | * | 1/1996 | Yamamoto ............. 219/121.63 |
| 5,829,125 A | | 11/1998 | Fujimoto et al. ............. 29/840 |
| 6,352,880 B1 | * | 3/2002 | Takai et al. ................. 438/106 |

FOREIGN PATENT DOCUMENTS

| DE | 19504967 A | 8/1996 | ......... H01L/21/603 |
| DE | 19751487 A | 6/1999 | ........... H01L/21/60 |
| EP | 0758145 A2 | 8/1996 | ........... H01L/21/60 |
| EP | 0918354 | 5/1999 | ....... H01L/21/8222 |
| EP | 0955676 | 11/1999 | ........... H01L/23/31 |
| JP | 07094845 A | 4/1995 | ............. H05K/1/18 |
| JP | 10022328 A | 1/1998 | ........... H01L/21/60 |
| JP | 10032224 A | 2/1998 | ........... H01L/21/60 |
| WO | WO9833211 | 7/1998 | ........... H01L/21/60 |
| WO | WO0011715 | 3/2000 | ........... H01L/23/31 |
| WO | WO0055925 | 9/2000 | ........... H01L/33/00 |

OTHER PUBLICATIONS

Patent Abstracts of Japan, vol. 1998, No. 02, Jan. 30, 1998, JP09260819.

* cited by examiner

Primary Examiner—M. Alexandra Elve
Assistant Examiner—Jonathan Johnson
(74) Attorney, Agent, or Firm—Steven R. Biren

(57) ABSTRACT

The present invention concerns a method of attaching at least one component (12) provided with a plurality of electrical connection terminals (18), to a connection support (10), in which: a) a connection support is provided, made of a material transparent to at least one wavelength of a laser beam, the support having terminals for receiving the component, b) the component (12) is disposed on the connection support (10), making the connection terminals of the component coincide with the reception terminals of the support, c) the connection terminals of the component are welded directly to the reception terminals of the support by applying a welding laser beam to the reception terminals, through the transparent material of the support.

12 Claims, 2 Drawing Sheets

METHOD OF ATTACHING A COMPONENT TO A CONNECTION SUPPORT BY WELDING WITHOUT THE ADDITION OF MATERIAL

The present invention relates to a method of attaching one or more components to a connection support. It relates in particular to the interconnection and packaging of electronic components or electro-optical components.

Various types of connection supports are known. A first type of support, referred to as an "interconnection support", is intended to receive a plurality of components. It is used as a component interconnection means, for example for forming electronic circuits. Another type of support, referred to as an "intermediate support", is generally combined with the component in its packaging. The role of the intermediate support is in essence to adapt the small pitch of the connection terminals of one or more components to the broader pitch of the printed circuit boards. Another role of intermediate supports is to reduce the stresses due to differences in coefficients of thermal expansion between the components and the interconnection supports, or between the components and the printed circuit boards.

The invention thus finds applications in the field of electronics and optoelectronics in particular for the interconnection of components and/or their packaging. The invention concerns in particular components for portable telephones.

Documents (1) to (10), whose complete references are given at the end of the description, describe various known techniques for the electrical and mechanical connection of components.

Among these techniques there are in particular the attachment of components by balls of fusible material. This technique, also referred to as "Flip Chip", consists of covering connection terminals of a component, or the reception terminals of a support substrate, with a material with a low melting point. This material is generally in the form of protrusions or balls. After having disposed the component on the support substrate, having taken care to make the corresponding terminals coincide, the fusible material is heated to be shaped and weld the contact terminals to the reception terminals. This is welding where the fusible material constitutes an added material.

The melting of the fusible material can be caused by heating the assembly formed by the component and the support, covered with balls. This is the case in particular when the melting point is sufficiently low not to alter the component. On the other hand, when the component is fragile, the fusible material of the balls can also be heated locally, for example by means of a laser beam.

The technique of connection by balls of fusible material requires a relatively large number of process steps. It is necessary in fact to provide the component and the connection support with pins, which are isolated from each other and which are made from a material which can be wetted by the fusible material. It is then necessary to cover the pins with fusible material and finally it is necessary to proceed with the welding per se.

In addition, the balls of fusible material maintain a certain spacing between the component or components and the connection support. This spacing may, in some cases, impair the compactness of the component and there is a risk that it may be prejudicial to good protection thereof.

Finally, the addition material for the welds, such as the fusible material, and the bonding layers receiving the fusible material, are liable to contain lead, which is harmful to the environment.

It is an object of the present invention to propose an attachment method which does not present the difficulties or limitations mentioned above.

One object of the invention is in particular to propose a simple and economical attachment method which makes it possible to reduce the number of operating steps.

Another object of the invention is to propose a method which avoids the use of lead.

Another object of the invention is to propose a packaging of the components which is particularly compact and reliable.

To achieve these objects, the invention has more particularly for its aim to provide a method of attaching at least one component provided with a plurality of electrical connection terminals, to a connection support, in which:

a) a connection support is provided, made of a material transparent to at least one wavelength of a laser beam, and having at least a first face with reception terminals matching the connection terminals of the component, the reception terminals comprising a material able to be welded to the connection terminals of the component without the addition of material, b) the component is disposed on the first face of the connection support, making the connection terminals of the component coincide with the reception terminals of the support, c) the connection terminals of the component are welded to the reception terminals of the support by applying a welding laser beam to the reception terminals through the transparent material of the support.

The use of a transparent material for the support makes it possible to access the reception terminals with precision and to apply thereto the energy necessary for welding. It should be emphasized that, in the case of the invention, the welding is a direct welding of the material or materials of the reception terminals to the material or materials of the connection terminals. In other words, no fusible material, or addition metal, is previously put in place on the terminals.

The material of the terminals can be chosen preferably from among: nickel, iron, and/or alloys thereof. These materials have the particularity of being able to be heated greatly in a localized fashion by means of the laser beam. A rapid welding can then be effected without a large quantity of heat being emitted to the connection support. This makes it possible to use relatively fragile materials for the support. Moreover, the weld remains limited solely to the parts of the reception and contact terminals which have been subjected to the laser beam.

For supports which are not very sensitive to heat, other materials can of course be used for producing the contact or reception terminals.

The welding of the reception terminals to the connection terminals can be a step by step welding. In this case, the various pairs of facing terminals are welded one after the other. The use of a laser beam in fact allows welding of about one microsecond long. As an alternative, the welding of several pairs of terminals can also be concomitant. This can take place while having recourse, for example, to holographic techniques for subjecting the support to the laser according to a holographic pattern corresponding to the terminals.

The invention can, as indicated in the introductory part, be used to advantage both for the interconnection of various components and for the packaging of the components.

In the first case, that is to say that of the interconnection of components, it is possible to attach a plurality of components to the same support provided with connection tracks selectively connecting various reception terminals together.

The connection tracks can thus electrically connect together terminals of the same component or different components. They can also serve to connect the components to power supply sources and/or signal input/output terminals provided on the connection support.

In the applications relating to the packaging of components, the method of the invention can be used to attach the components to intermediate supports. As mentioned in the introductory part, the intermediate supports can have a role of protecting the components, a role of redistributing the contact terminals in order to adapt the pitch thereof to a reception support, and finally a role of reducing the mechanical stresses due to differences in coefficients of thermal expansion in the parts in mechanical contact.

In particular the material of the intermediate connection support can be chosen with a coefficient of expansion higher than that of the component, and lower than that of a final reception support to which the component, provided with the intermediate support, must be attached. The connection support used as an intermediate support may advantageously be produced from a material of the sol-gel type. The coefficient of thermal expansion of these materials can in fact easily be controlled. In addition, the sol-gel materials allow the formation of a connection support whose face that is turned towards the component at least partly adopts the shape. An intermediate support of the sol-gel type can serve, for example, to effect an embedding of the component.

The intermediate support can have on its face opposite to the component a plurality of secondary terminals connected respectively to the reception terminals, for example by means of metallized holes. The pitch of the secondary terminals can be adapted to a final connection support for which the component is intended.

According to a particular implementation of the method, the secondary terminals can also be offset with respect to the reception terminals in a plane parallel to the first and second faces. This allows the application of a welding beam through the second face and perpendicular thereto. In this case, the beam passes through a minimum thickness of the support.

In order to obtain a plurality of components associated individually with intermediate supports, the components coming from the same primary substrate can be attached to a connection support and then, after the attachment, the primary substrate and the connection support can be cut in a concomitant fashion. This cutting then makes it possible to define the components, respectively fixed to connection support parts whose dimensions are adjusted to the components. An individual attachment of each component to an intermediate support does, however, remain possible.

Finally, the invention concerns a device comprising at least one component with connection terminals and a connection support with reception terminals. In accordance with the invention, the connection support is transparent to light and the reception terminals are directly welded against the connection terminals.

The invention will be further described with reference to examples of embodiment shown in the drawings to which, however, the invention is not restricted:

In the following description, identical, similar or equivalent parts of the various Figures are marked by the same reference signs. Moreover, for reasons of clarity of the Figures, the various parts shown are not necessarily depicted according to a uniform scale.

Figure 1:
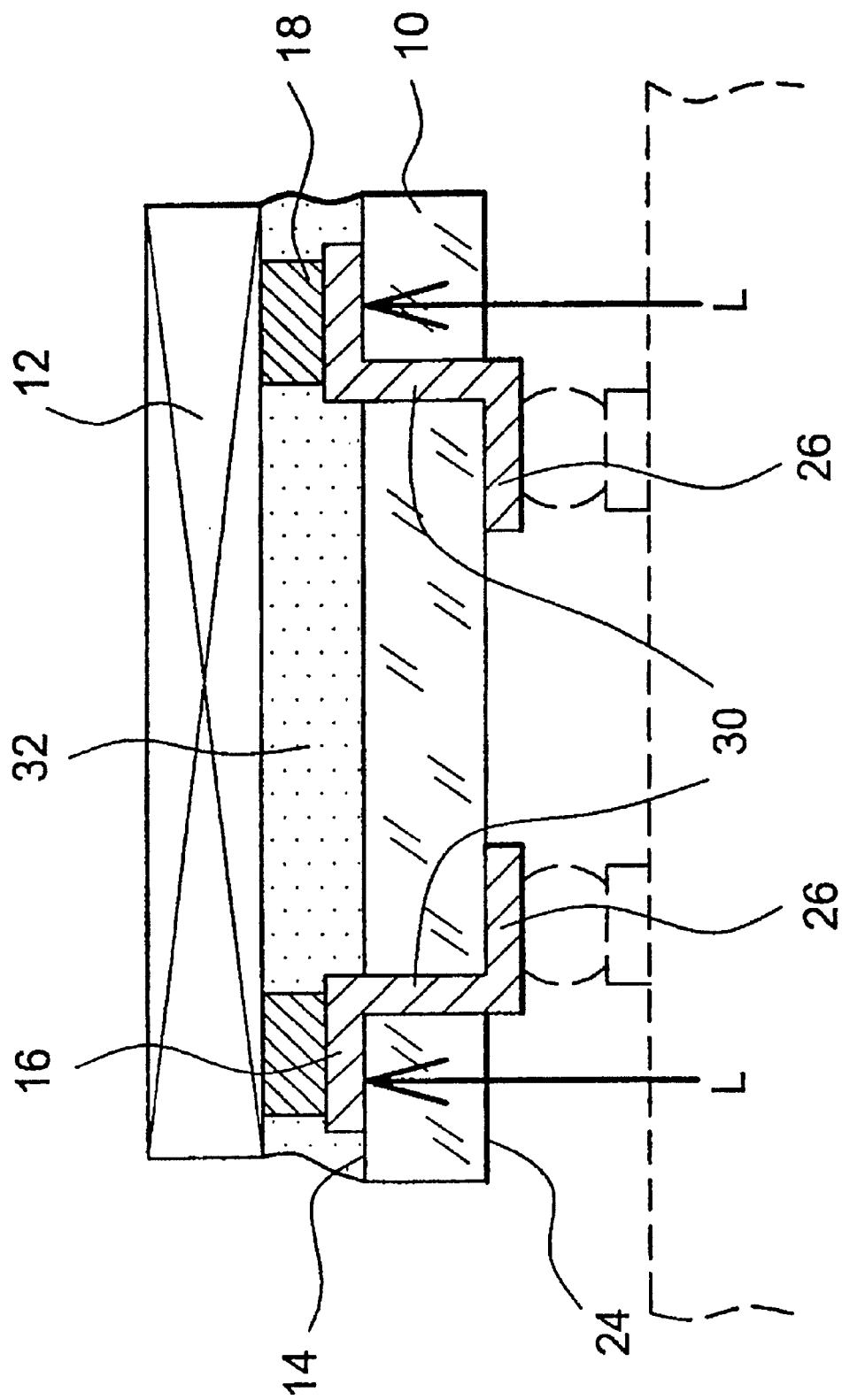
FIG. 1 is a schematic section of a component and of a connection support used as an intermediate support, and illustrates a step in an attachment method according to the invention.

FIG. 1 shows an electronic component 12, such as a chip, attached to an intermediate connection support 10. The intermediate support 10, for example a sheet of glass, has on a first face 14, turned towards the component, a plurality of reception terminals 16. The locations of the reception terminals coincide with a distribution pattern of contact terminals 18 of the component 12. These are situated on a face of the component turned towards the intermediate support. It can also be seen that the relative arrangement of the component 12 and intermediate support 10 is such that each connection terminal 18 is in contact with one of the reception terminals 16. For reasons of clarity, the Figure shows only two pairs of terminals. A much greater number of terminals can, however, equip the components and supports.

The intermediate connection support also has secondary terminals 26 on a second face 24 opposite to the first face 14. Each secondary terminal 26 of the second face is respectively connected to a reception terminal 16 of the first face through a metallized hole 13 which passes through the insulating support. The terminals can be extended and connected to the metallized holes by conductive tracks, if necessary.

The manufacture of the terminals on the connection support, and the conductive tracks or metallized holes, relates to techniques which are well known per se. In particular, the tracks and metallizations can be formed by deposition, and then lithography and etching, by electrochemical growth or by screen printing. Various techniques can also be adopted for the forming of the holes through the support. These techniques can be adapted according to the material of the support. It is particularly possible to adopt etching techniques or laser machining techniques. Machining the glass by laser makes it possible for example to form holes whose diameter can be reduced to 30 $\mu$m.

When the component 12 is disposed on the support 10, as shown in FIG. 1, the welding of the reception terminals 16 to the connection terminals 18 of the component can take place. A laser beam, represented schematically by arrows L, is applied to the reception terminals 16 through the connection support 10. The connection support has in fact the particularity of being transparent to laser radiation. It thus offers access to the reception terminals, irrespective of the size of the component or any adjacent components. The welding is a direct welding between the material of the reception terminals and that of the contact terminals of the component. In other words, the welding is a localized welding and takes place without added metal, without any intermediate fusible material between the terminals.

The terminals 26 of the second face 24 are preferably laterally offset with respect to the reception terminals 16. This allows application of the laser beam at a normal angle of incidence to the support.

The laser beam can successively be applied to each of the terminals to be welded or, collectively, to a plurality of terminals.

Reference 32 indicates a protection material for the component placed between the component and the intermediate support. It is for example a liquid material, such as an epoxy, which can be introduced by capillary attraction, and then cured. The role of this material is to protect the component and the connection terminals against any chemical and/or atmospheric attacks. It also helps to guarantee good mechanical contact between the component and the intermediate support by partially relieving the terminals from any forces liable to be exerted between these parts. Finally, in applications where the component is of the optoelectronic type, the protection material 32 can also be used as a light guide.

In the particular use of the connection support illustrated by FIG. 1, this has, parallel to the connection plane, dimensions substantially adjusted to those of the component. This characteristic can be obtained, for example, by means of a concomitant cutting of a substrate including the component and a substrate supplying the support. It procures important advantages in terms of compactness, in particular for equipment such as portable telephones. Good compactness is also obtained perpendicular to the connection plane because of the absence of balls of fusible material.

The component, provided with its intermediate support, can then be attached to a printed circuit board or to another interconnection support. This attachment can take place also in accordance with the invention or, in a conventional fashion, by means of balls of fusible material. Such balls, and an interconnection support, are outlined in broken lines by way of indication.

Figure 2:
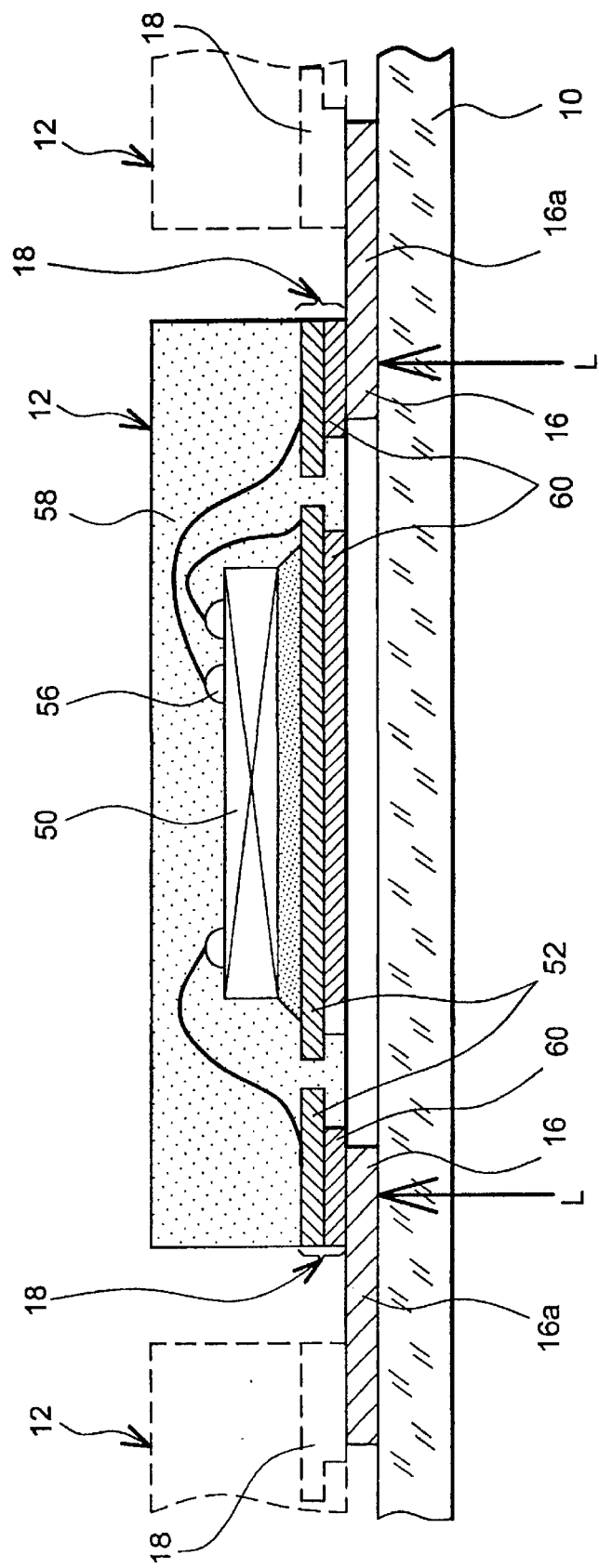
FIG. 2 is a schematic section of a component and of a connection support used for the interconnection of various components.

FIG. 2 shows the attachment of a component 12 to an interconnection support 10.

The component 12 has a chip 50 bonded to a conductive copper frame 52, by a face which does not comprise any terminals. The conductive frame has a certain number of extensions, mutually insulated, in the form of conductive lugs 18. The conductive lugs are disposed on the periphery of the frame 52 and connected to terminals 56 of the chip 50. The terminals 56 are situated on a face of the component opposite to the frame. The connection of the lugs 18 to the terminals 56 is a connection by wires, well known per se.

An insulating material 58 is used for the molding-on of the chip and conductive frame. The insulating material 58 extends between the conductive lugs 18 without, however, covering the face thereof opposite to the chip. The same applies to the part of the frame situated under the chip.

The exposed faces of the frame 52 and of the conductive lugs are covered with a plating 60, for example nickel.

The interconnection support 10, like that of FIG. 1, is made from a material which is transparent to a welding laser beam. It has on its face turned towards the component reception terminals 16 which are extended as conductive tracks 16a. In the particular example of FIG. 2, the terminals and tracks are, however, present only on one of the faces of the support 10.

The reception terminals are put in contact with the conductive lugs 18, which here fulfill the same role as the connection terminals of the component in FIG. 1.

The laser welding, indicated with the reference L, also takes place through the support 10, taking advantage of its properties of transparency.

Other components attached to the same interconnection support are shown in outline in broken lines. It can be seen that the conductive tracks 16a which extend the reception terminals of the interconnection support are also welded to the conductive lugs of the other components and thus provide the electrical interconnection of the components.

What is claimed is:
1. A method of attaching at least one component (12) provided with a plurality of electrical connection terminals (18) to a connection support (10), in which:
   a) a connection support (10) is provided, made of a material transparent to at least one wavelength of a laser beam, and having at least a first face (14) with reception terminals (16) matching the connection terminals (18) of the component, the reception terminals (16) comprising a material able to be welded to the connection terminals of the component without the addition of material,
   b) the component is disposed on the first face (14) of the connection support (18), making the connection terminals of the component coincide with the reception terminals (16) of the support,
   c) the connection terminals of the component are welded directly to the reception terminals of the support by applying a welding laser beam (L) to the reception terminals through the transparent material of the support.

2. A method as claimed in claim 1, in which a plurality of components are attached to the same support provided with connection tracks (16a) selectively connecting reception terminals together.

3. A method as claimed in claim 1, in which at least one component (12) is attached to a connection support (10), provided, on a second face (24), opposite to the first face (14), with a plurality of secondary terminals (26), connected respectively to reception terminals (16) of the first face.

4. A method as claimed in claim 3, in which the secondary terminals (26) are offset with respect to the reception terminals (16) in a plane parallel to the first and second faces, to allow the application of a welding beam (L) through the second face and perpendicular thereto.

5. A method as claimed in claim 1, in which a plurality of components fixed to the same substrate are attached to a connection support, and in which, after the attachment, the substrate and the connection support are cut concomitantly, in order to delimit components fixed to connection support parts to the adjusted dimensions.

6. A method as claimed in claim 1, in which step a) comprises the formation of a connection support (10) based on a material chosen from among glass and materials of the sol-gel type, and then the fitting of the support with the reception terminals.

7. A method as claimed in claim 6, comprising the formation of a support based on sol-gel with a first face at least partly following the shape of the component.

8. A method as claimed in claim 1, in which step a) comprises the formation of a connection support based on a material having a coefficient of thermal expansion greater than or equal to a coefficient of thermal expansion of the component.

9. A method as claimed in claim 1, in which the reception terminals (16) are produced from a material chosen from among nickel and/or iron and/or alloys thereof.

10. A method as claimed in claim 1, also comprising, after step c), the placing of a protective material (32) between the connection support and the component.

11. A method as claimed in claim 1, in which the welding of the reception terminals (16) to the connection terminals (18) is a step-by-step welding.

12. A method as claimed in claim 1, in which the welding of the reception terminals (16) to the connection terminals (18) is a collective holographic pattern welding.

* * * * *